US012761284B2

(12) United States Patent
Bharathraj et al.

(10) Patent No.: US 12,761,284 B2
(45) Date of Patent: Oct. 13, 2026

(54) METHOD AND SYSTEM WITH BATTERY PARAMETER ESTIMATION FOR REST PERIOD

(71) Applicant: SAMSUNG ELECTRONICS CO., LTD., Suwon-si (KR)

(72) Inventors: Sagar Bharathraj, Bengaluru (IN); Shashishekara Parampalli Adiga, Bengaluru (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 695 days.

(21) Appl. No.: 18/308,541

(22) Filed: Apr. 27, 2023

(65) Prior Publication Data

US 2023/0400525 A1 Dec. 14, 2023

(30) Foreign Application Priority Data

Jun. 8, 2022 (IN) ............................ 202241032782
Jul. 22, 2022 (KR) ........................ 10-2022-0091211

(51) Int. Cl.
*G01R 31/388* (2019.01)
*G01R 31/36* (2020.01)
(Continued)

(52) U.S. Cl.
CPC ....... *G01R 31/388* (2019.01); *G01R 31/3648* (2013.01); *G01R 31/367* (2019.01); *G01R 31/389* (2019.01); *G01R 31/392* (2019.01)

(58) Field of Classification Search
CPC .............. G01R 31/388; G01R 31/3648; G01R 31/367; G01R 31/389; G01R 31/392; G01R 31/3835
(Continued)

(56) References Cited

U.S. PATENT DOCUMENTS 10,566,811 B2 * 2/2020 Howey ................. H01M 10/42
2015/0084639 A1 * 3/2015 Joe ..................... G01R 31/3842 324/426
(Continued)

FOREIGN PATENT DOCUMENTS

EP 2 952 919 A1 12/2015
KR 10-0805116 B1 2/2008
(Continued)

OTHER PUBLICATIONS

Indian Office Action Issued on Jun. 13, 2025, in Counterpart Indian Patent Application No. 202241032782 (7 Pages in English).

*Primary Examiner* — Arleen M Vazquez
*Assistant Examiner* — Robert P Alejnikov, Jr.
(74) *Attorney, Agent, or Firm* — NSIP Law

(57) ABSTRACT

The following description relates to a method and system with battery parameter estimation for a rest period. A method of estimating a battery parameter of a battery for a rest period of the battery includes: based on determining that an intercalation flux of the battery satisfies a predetermined condition, calculating an open circuit voltage (OCV) of the battery, wherein the OCV is calculated based on an initial voltage, a first time constant corresponding to a positive electrode of the battery, a second time constant corresponding to a negative electrode of the battery, a first constant, a second constant, and a value of a time variable for the rest period; and estimating the battery parameter based on the calculated OCV of the battery.

17 Claims, 6 Drawing Sheets

400

(51) Int. Cl.

| | |
|---|---|
| ***G01R 31/367*** | (2019.01) |
| ***G01R 31/389*** | (2019.01) |
| ***G01R 31/392*** | (2019.01) |

(58) Field of Classification Search

USPC .......................................................... 324/426

See application file for complete search history.

(56) References Cited

U.S. PATENT DOCUMENTS

| | | | | |
|---|---|---|---|---|
| 2016/0274193 | A1* | 9/2016 | Imaizumi ........... | G01R 31/3835 |
| 2017/0052228 | A1* | 2/2017 | Hariharan .......... | G01R 31/3842 |
| 2021/0119464 | A1* | 4/2021 | Kim ...................... | H01M 10/44 |

FOREIGN PATENT DOCUMENTS

| | | | |
|---|---|---|---|
| KR | 10-2014-0071060 | A | 6/2014 |
| KR | 10-2017-0022855 | A | 3/2017 |
| WO | WO 2020/208762 | A1 | 10/2020 |

* cited by examiner

METHOD AND SYSTEM WITH BATTERY PARAMETER ESTIMATION FOR REST PERIOD

CROSS-REFERENCE TO RELATED APPLICATIONS

This application claims the benefit under 35 USC § 119(a) of Indian Patent Application No. 202241032782 filed on Jun. 8, 2022, at the Indian Patent Office, and Korean Patent Application No. 10-2022-0091211 filed on Jul. 22, 2022, at the Korean Intellectual Property Office, the entire disclosures of which are incorporated herein by reference for all purposes.

BACKGROUND

1. Field

The following description relates to a method and system with battery parameter estimation for a rest period.

2. Description of Related Art

In general, many consumers are using wireless devices such as mobile phones, laptop computers, tablets, and smart watches. Rechargeable batteries (e.g., lithium-ion batteries (LIBs)) are usually used to provide portable electricity and power to most wireless devices. In addition, there are electric vehicles (EVs) which operate on electrical energy stored in rechargeable batteries. However, such rechargeable batteries may be susceptible to safety and performance issues caused by internal short circuits.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of estimating a battery parameter of a battery for a rest period of the battery includes: based on determining that an intercalation flux of the battery satisfies a predetermined condition, calculating an open circuit voltage (OCV) of the battery, wherein the OCV is calculated based on an initial voltage, a first time constant corresponding to a positive electrode of the battery, a second time constant corresponding to a negative electrode of the battery, a first constant, a second constant, and a value of a time variable for the rest period; and estimating the battery parameter based on the calculated OCV of the battery.

The first constant may correspond to the positive electrode of the battery, and the method may further include: calculating the first constant based on an open circuit potential at the positive electrode of the battery, a state of charge (SOC) at the positive electrode of the battery, and a maximum concentration of an intercalation metal of the battery at the positive electrode of the battery.

The second constant may correspond to the negative electrode of the battery, and the method may further include: calculating the second constant based on an open circuit potential at the negative electrode of the battery, an SOC at the negative electrode of the battery, and a maximum concentration of an intercalation metal of the battery at the negative electrode of the battery.

The determining may correspond to the intercalation flux at a surface of each of the positive electrode and the negative electrode of the battery being equal to 0.

The initial voltage of the battery may be a voltage of the battery at the start of the rest period.

The battery parameter may be a state of health (SOH) of the battery, an SOC of the battery, an electrochemical parameter of the battery, or a state of short (SOS) of the battery.

In another general aspect, a system for estimating a battery parameter for a rest period, the system includes: one or more processors; memory storing instructions configured to, when executed by the one or more processors, cause the one or more processors to: determine whether an intercalation flux condition of a battery is satisfied; and based on the determining, calculate an open circuit voltage (OCV) of the battery based on an initial voltage of the battery, a first time constant corresponding to a positive electrode of the battery, a second time constant corresponding to a negative electrode of the battery, a first constant, a second constant, and a value of a time variable.

The instructions may be further configured to cause the one or more processors to estimate a battery parameter based on the calculated OCV of the battery.

The first constant may correspond to the positive electrode of the battery, and the instructions may be further configured to cause the one or more processors to calculate the first constant based on an open circuit potential at the positive electrode of the battery, a state of charge (SOC) at the positive electrode of the battery, and a maximum concentration of an intercalation metal of the positive electrode.

The second constant may correspond to the negative electrode of the battery, and the calculation unit may be further configured to calculate the second constant based on an open circuit potential at the negative electrode of the battery, an SOC at the negative electrode of the battery, and a maximum concentration of an intercalation metal of the negative electrode.

The determining may correspond to the intercalation flux at a surface of each of the positive electrode and the negative electrode of the battery being equal to 0.

The initial voltage of the battery may be a voltage of the battery at an initial point in time of the rest period.

The battery parameter may be a state of health (SOH) of the battery, an SOC of the battery, electrochemical parameters of the battery, or a state of short (SOS) of the battery.

In another general aspect, a method of determining an open circuit voltage (OCV) of a battery having a positive electrode and a negative electrode includes: based on determining that an intercalation flux condition of the battery is met in association with a rest period of the battery: determining an initial voltage of the rest period; determining a positive electrode component based on a state of charge (SOC) of the positive electrode or an open circuit potential of the positive electrode; determining a negative electrode component based on an SOC of the negative electrode or an open circuit potential of the negative electrode; and determining the OCV of the battery based on the initial voltage, the positive electrode component, and the negative electrode component.

The negative electrode component may be determined based also on a maximum concentration of intercalation metal at the negative electrode, and the positive electrode component may be determined based also on a maximum concentration of intercalation metal at the positive electrode.

The OCV may be determined as a function of time for the rest period and wherein the OCV as a function of time may model exponential voltage decay during the rest period.

The method may be performed by a battery management system that manages charging of the battery.

The determining the OCV may include adding the initial voltage, the negative electrode component, and the positive electrode component.

The intercalation flux condition may correspond to 0 intercalation flux at both the positive and the negative electrodes.

A battery parameter may be computed based on the OCV, wherein the battery parameter is either a state of health (SOH) of the battery, an SOC of the battery, an electrochemical parameter of the battery, or a state of short (SOS) of the battery.

Other features and aspects will be apparent from the following detailed description, the drawings, and the claims.

BRIEF DESCRIPTION OF THE DRAWINGS

These and other features, aspects, and advantages of the present disclosure will be better understood when the following detailed description is read with reference to the accompanying drawings, throughout which like characters represent like parts.

Figure 1:
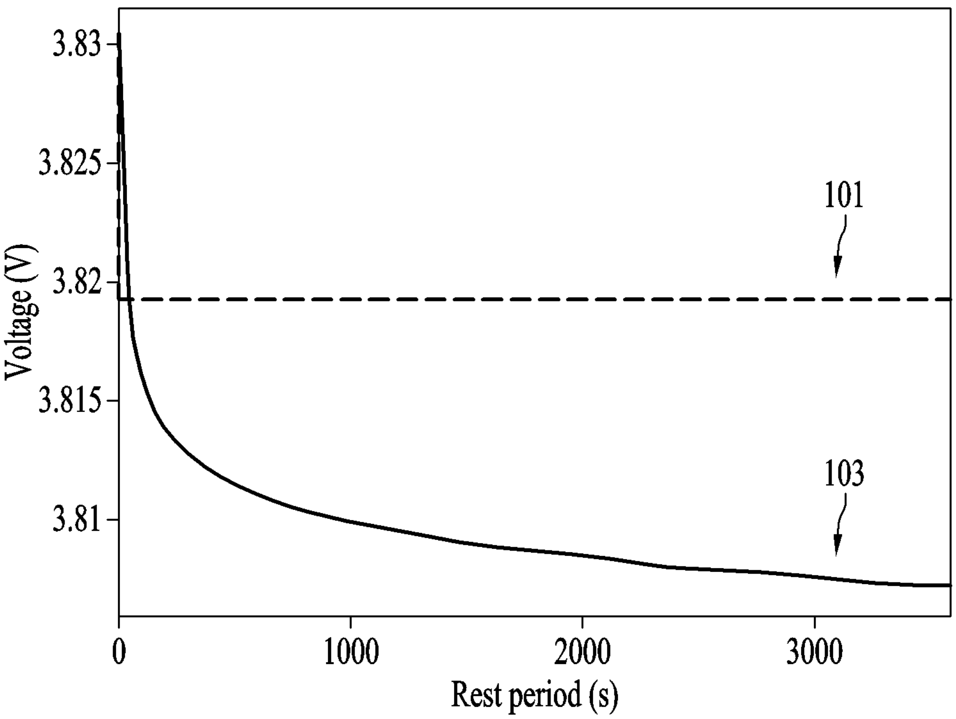
FIG. 1 RELATED ART
FIG. 1 illustrates an example of a comparison between an actual voltage and an estimated voltage of a battery in a rest period according to related art.

Throughout the drawings and the detailed description, unless otherwise described or provided, the same or like drawing reference numerals will be understood to refer to the same or like elements, features, and structures. Furthermore, elements in the drawings are illustrated for simplicity and are not necessarily drawn to scale. For example, the flowcharts illustrate methods in terms of prominent operations. Moreover, in terms of a configuration of systems, one or more of components of a system may be represented in the drawings by conventional symbols, and the drawings may illustrate only particular details that promote understanding of examples of the present disclosure so as not to obscure the drawings with details that will be readily apparent to those skilled in the art having benefit of the description herein.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", orA, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

Hereinafter, examples will be described in detail with reference to the accompanying drawings.

FIG. 1 illustrates an example of a comparison between an actual voltage and an estimated voltage of a battery in a rest period according to related art.

Voltage recovery performed during a rest period may be used to accurately assess electrochemical parameters such as solid state diffusivity, a state of health and state of short (SOH-SOS) in LIBs. It may also be used to assess a relationship between an open circuit voltage (OCV) and a state of charge (SOC).

As illustrated in FIG. 1, when a rest period is applied, a voltage profile estimated by existing techniques is erroneous when compared to actual battery data. In FIG. 1, curve 103 represents an actual voltage profile of a battery in the rest period and curve 101 represents a voltage profile of the battery estimated by existing techniques in the rest period of the battery. As illustrated in FIG. 1, the estimated voltage profile is clearly different from the actual voltage profile. Existing techniques do not consider exponential voltage decay in the rest period. Existing techniques may at best capture only a voltage drop associated with removal of a current, but not exponential voltage relaxation during the rest period (and its features) as existing techniques do not consider physical aspects of batteries that may be modeled by diffusion equilibration equations, nor do existing solve such equations. For example, at a low c-rate of C/20, an error in the voltage profile predicted by the existing techniques may be around 0.015 volts (V) (15 millivolts (mV)), which is quite significant. Even for a rest period of 200 seconds, the error may be around 5 mV. This error may be amplified at a higher c-rate.

Because voltage profiles may be integral to charging calculations, with an average error of 15 mV for a 3-minute rest period, even a few charging and discharging cycles with rest periods may lead to a significant accumulation of errors. With regular rest periods being employed with dynamic charge profiles, particularly in electric vehicles (EVs), the number of accumulated errors can be significant, leading to serious battery health and safety issues.

In a rest period, sudden exponential decay of a voltage (as illustrated in FIG. 1) is caused by solid phase diffusion induced relaxation and equilibration inside electrode particles after removal of a flux. The rest period means that a flux is 0 (J=0) or that current density is 0 at a particle surface (or interface). This suggests modification of system boundary conditions and thus concentration profiles, which is not addressed in existing charging techniques.

Furthermore, if rest period profiles (profiles that include rest periods) are accurately captured on-board, the profiles may be used for in-situ determination of electrochemical-thermal (ECT) parameters like diffusivity, state estimations like a state of short, state of health (SOS-SOH) and a state of charge (SOC) without needing any special probe cycles.

Accordingly, there is a need for practical methods of early short circuit detection and estimation of short resistance.

Figure 2:
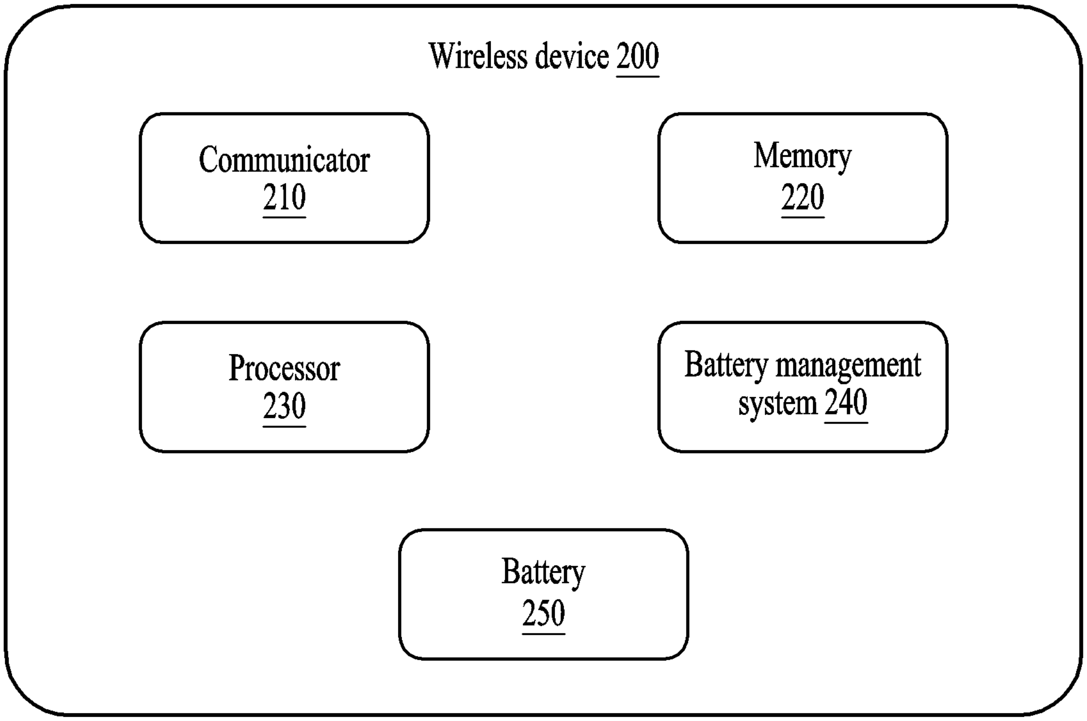
FIG. 2 illustrates an example of a wireless device for detecting a short circuit in a battery, according to one or more embodiments.

FIG. 2 illustrates an example of a wireless device 200 for detecting a short circuit in a battery, according to one or more embodiments. The wireless device 200 may be, or may include, a mobile phone, a smartphone, a tablet computer, a handheld device, a laptop computer, a wearable computing device, an Internet of Things (IoT) device, a digital camera, or the like, but examples are not limited thereto. The wireless device 200 may also be, or may include, a device, an apparatus, or a system for estimating battery parameters in a rest period of an EV, a device for estimating battery parameters for an EV, or the like, but examples are not limited thereto.

Referring to FIG. 2, the wireless device 200 may include a communicator 210, a memory 220, a processor 230, a battery management system (BMS) 240, and a battery 250.

The communicator 210 may be configured to communicate internally between internal units of wireless devices and external devices such as a printer, a fax machine, and the like, through one or more of networks. The memory 220 may store instructions to be executed by the processor 230. The processor 230 may be configured to execute the instructions stored in the memory 220 and perform various operations.

The memory 220 may include one or more of computer-readable storage media. The memory 220 may include non-volatile storage elements; the memory 220 is not a signal per se. Examples of non-volatile storage elements may include a magnetic hard disc, an optical disc, a floppy disc, a flash memory, an electrically programmable memory (EPROM), or an electrically erasable and programmable memory (EEPROM). In addition, the memory 220 may, in some examples, be considered as a non-transitory storage medium. The term "non-transitory" refers to a storage medium that is not embodied in a carrier wave or a propagated signal. However, the term "non-transitory" should not be interpreted as meaning that the memory 220 is non-changeable. In some examples, the non-transitory storage medium (e.g., random access memory (RAM) or a cache) may store data that changes over time.

The BMS 240 may be connected to the memory 220, the processor 230, and the battery 250. The BMS 240 may be an electronic system, for example, a component of a rechargeable battery (a cell or a battery pack) that manages the battery 250. The BMS 240 may be configured to manage charging and discharging of the battery 250, to provide notifications about the state of the battery 250, and to provide critical safeguards to protect the battery 250 from damage, such as short circuit detection. The battery 250 is a rechargeable battery, for example a lithium-ion battery (LIB).

Although FIG. 2 illustrates hardware elements of the wireless device 200, examples are not limited thereto. In other examples, the wireless device 200 may include a smaller or larger number of elements. Furthermore, the labels or names of the elements are used only for illustrative purpose and the present disclosure is not limited thereto.

Figure 3:
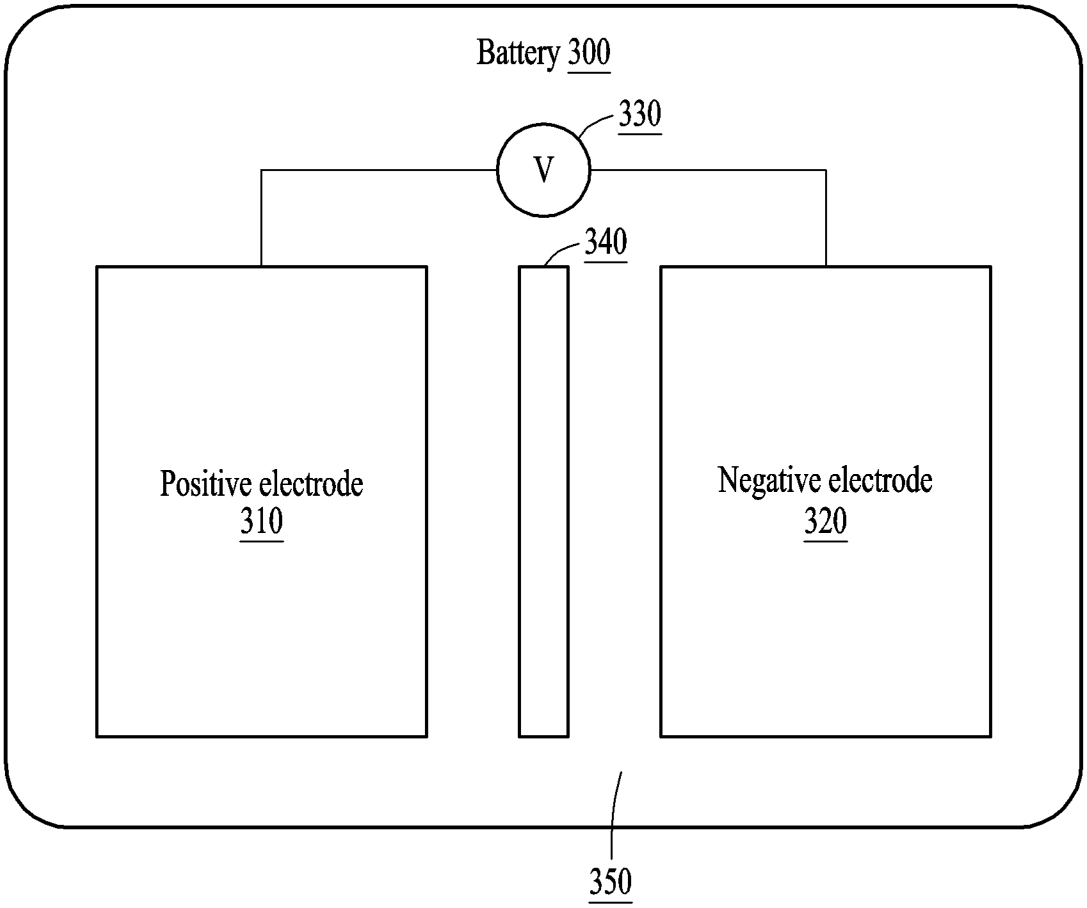
FIG. 3 illustrates an example of a battery of a wireless device, according to one or more embodiments.

FIG. 3 illustrates an example of a battery 300 of a wireless device. The battery 300 be any battery (e.g., an LIB, a lithium-polymer battery, etc.) that has a membrane (e.g., a separator) separating positive and negative electrodes. Shapes and sizes of the battery 300 may vary depending on a shape and size of the wireless device 200, an amount of power needed for the wireless device 200, and the like. As illustrated in FIG. 2, the battery 300 includes a positive electrode 310, a negative electrode 320, a voltage source 330, a separator 340, and/or an electrolyte 350. The battery 300 may provide power to components of a wireless device (e.g., the wireless device 200 of FIG. 2).

The positive electrode 310 may enable positive electric current flows into a polarized electrical device. A shape and size of the positive electrode 310 may vary depending on a shape and size of the battery 300 and be made of various materials.

The negative electrode 320 may enable positive electric current flows out of the polarized electrical device. A shape and size of the negative electrode 320 may vary depending on the shape and size of the battery 300 and be made of various materials.

The voltage source 330 may charge the battery 300.

The separator 340 separates the positive electrode 310 and the negative electrode 320 and generally includes a membrane (e.g., a microporous membrane). A shape and size of the separator 340 may vary depending on the shape and size of the battery 300.

The electrolyte 350 may be any liquid substance which acts as a medium to conduct electricity between the positive electrode 310 and the negative electrode 320 and to thus store energy in the positive electrode 310 and the negative electrode 320. The electrolyte 350 may vary depending on a type and purpose of the battery 300.

In an example, the battery 300 may be an LIB. Although FIG. 3 illustrates an example of components of the battery 300, in other examples, the battery 300 may have fewer or more components than as illustrated in FIG. 3.

An example described below with reference to FIGS. 4 and 5 may reduce health and safety issues associated with a short circuit in the battery 300 by providing early detection of any potential short circuit in the battery 300.

Figure 4:
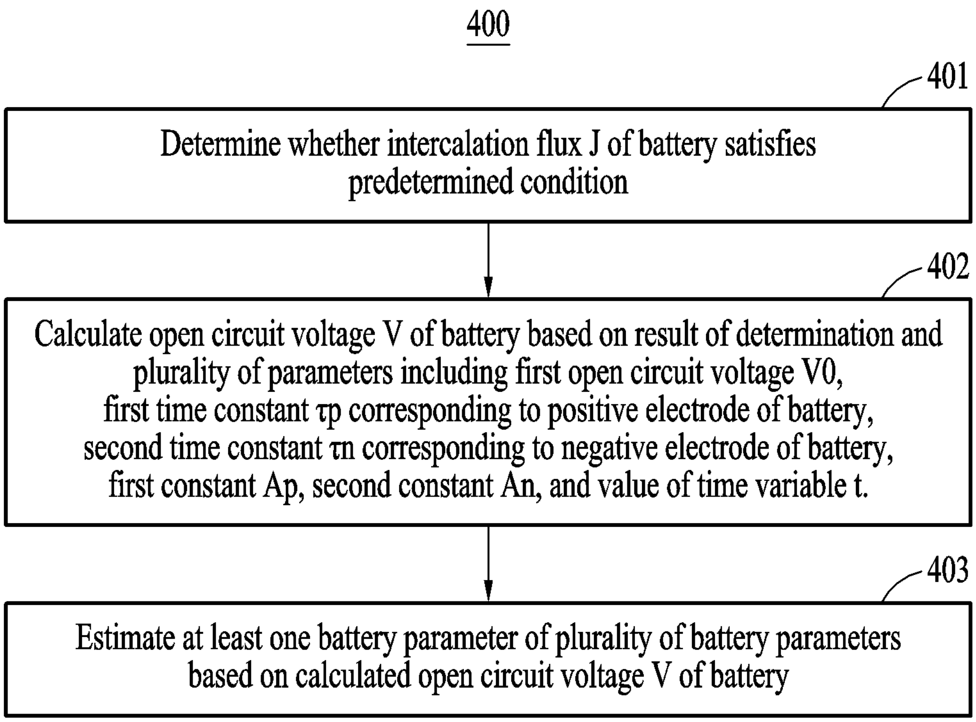
FIG. 4 illustrates an example of a method of estimating a plurality of battery parameters in a rest period, according to one or more embodiments.
Figure 5:
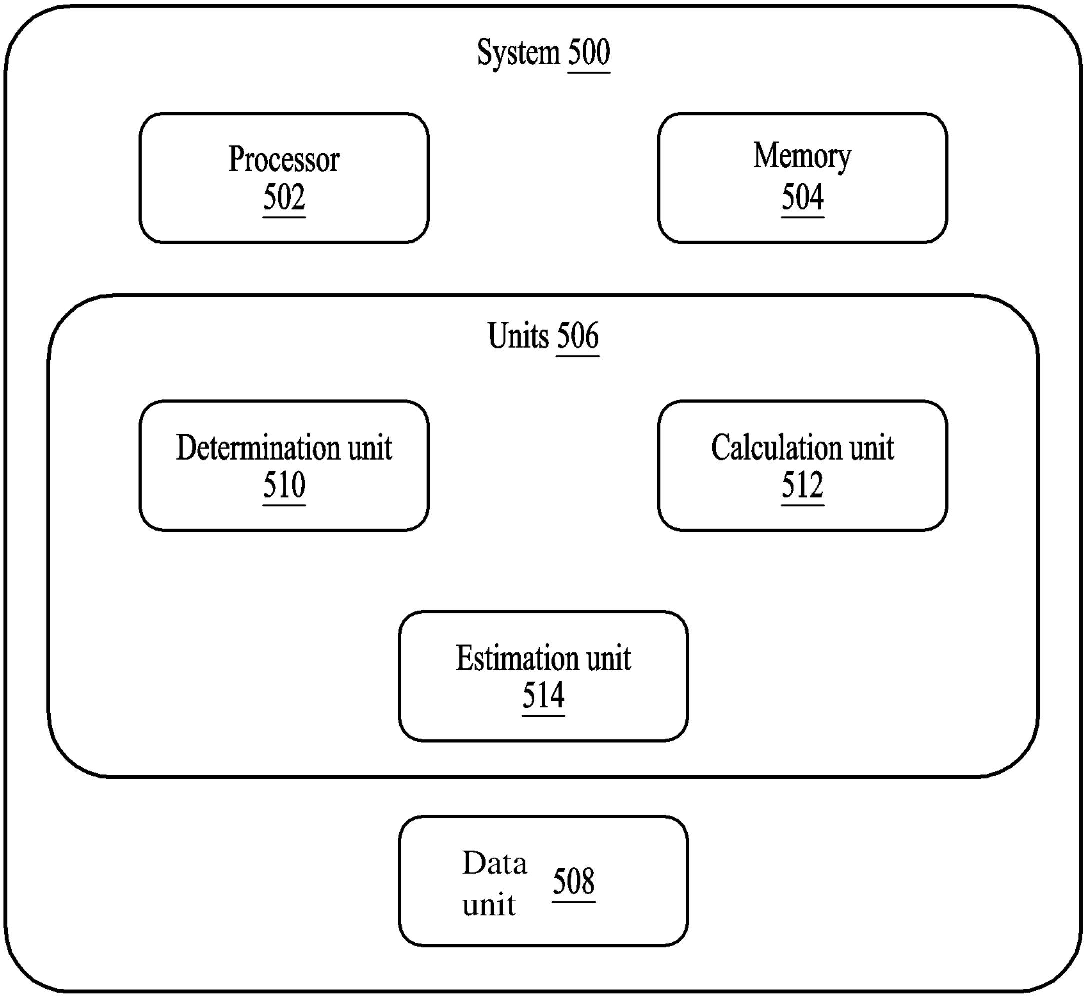
FIG. 5 illustrates an example of a system for estimating a plurality of battery parameters in a rest period, according to one or more embodiments.

FIG. 4 illustrates an example of a method 400 of estimating battery parameters in a rest period. FIG. 5 illustrates an example of a system 500 for estimating battery parameters in a rest period. FIGS. 4 and 5 are described together.

The system 500 may be a part of the BMS 240. In another example, the system 500 may be a part of a wireless device (e.g., the wireless device 200 of FIG. 2) and may be connected to a BMS (e.g., the BMS 240 of FIG. 2). The system 500 may include a processor 502, a memory 504, units 506, and a data unit 508, but examples are not limited thereto. The units 506 and the memory 504 may be connected with the processor 502.

The processor 502 may be a single processing unit or multiple units, all of which may include multiple computing units. The processor 502 may be implemented as one or more of microprocessors, microcomputers, microcontrollers, digital signal processors, central processing units (CPUs), state machines, logic circuits, and/or any device that controls signals based on operational instructions. Among other capabilities, the processor 502 may be configured to fetch and execute computer-readable instructions and data stored in the memory 504. The units may be implemented as software modules. The division of functionality among the modules/units is somewhat arbitrary and different divisions and arrangements may be used.

The memory 504 may include any type of non-transitory computer-readable medium including, for example, a volatile memory, such as static random access memory (SRAM) and dynamic random access memory (DRAM), and/or a non-volatile memory, such as read-only memory (ROM), EEPROM, a flash memory, a hard disc, an optical disc, and a magnetic tape.

The units 506 may be implemented as routines, programs, objects, components, data structures, and the like, which perform particular tasks or implement data types. The units 506 may also be implemented as a signal processor(s), a state machine(s), a logic circuit, and/or any other device or component that controls signals based on operational instructions.

In addition, the units 506 may be implemented by hardware, instructions executed by a processing unit, or a combination thereof. The processing unit may include a computer, a processor, such as the processor 502, a state machine, a logic array, or any other suitable devices capable of processing machine instructions. The processing unit may be a general-purpose processor which executes instructions to allow the general-purpose processor to perform required tasks, or the processing unit may be dedicated to performing required functions. In another example, the units 506 may be machine-readable instructions that perform any of the above-described functions when executed by the processor/processing unit.

The units 506 may include a determination unit 510, a calculation unit 512, and an estimation unit 514.

The various units 510 through 514 may communicate with each other. The various units 510 through 514 may be a part of the processor 502. The processor 502 may be configured to perform functions of the units 510 through 514. The data unit 508 may serve, amongst other things, as a repository for storing data processed, received, and generated by one or more of the units 506.

A memory (e.g., the memory 220 of FIG. 2) and a processor (e.g., the processor 230 of FIG. 2) of the wireless device (e.g., the wireless device 200 of FIG. 2) may be connected to a BMS and perform functions of the memory 504 and the processor 502 of the system 500.

FIG. 4 illustrates an example method 400 of estimating battery parameters in a rest period. In the rest period, a value of a current I in the wireless device may be 0, for example, when the wireless device is in a switch-off (or powered-off) mode. In another example, in the rest period, the value of the current I in the wireless device may be less than a predefined threshold, for example, when the wireless device is in a flight mode, lower-power mode, or an idle mode. The predefined threshold may be configurable. As an example, the predefined threshold may be $\frac{1}{20}$ of a maximum current value.

In operation 401, the method 400 may determine whether an intercalation flux J of a battery satisfies a predetermined condition. The predetermined condition may correspond to the intercalation flux J at a surface of each of a positive electrode (e.g., the positive electrode 310 of FIG. 3) and a negative electrode (e.g., the negative electrode 320 of FIG. 3) of the battery (e.g., the battery 300 of FIG. 3) being equal to 0. Accordingly, the determination unit 510 may determine whether the intercalation flux J at the surface of the positive electrode and at the surface of the negative electrode of the battery is equal to 0. In particular, during rest periods, the intercalation flux J applied to the surface of each of the electrodes is 0, leading to current density also being 0. As a result, there are homogenous boundary conditions at a center and a surface in which the intercalation flux J is 0.

In operation 403, based on a result of the determining of operation 401, the method 400 may calculate an open circuit voltage (OCV) V of the battery based on various parameters (description thereof follows). The result of the determining may correspond to the intercalation flux J at the surface of each of the positive electrode (e.g., the positive electrode 310 of FIG. 3) and the negative electrode (e.g., the negative electrode 320 of FIG. 3) of the battery (e.g., the battery 300 of FIG. 3) being equal to 0. The aforementioned parameters for calculating the OCV V may include an initial voltage $V_0$ (i.e., $V_{t=0}$) a first time constant $\tau_p$ corresponding to the positive electrode of the battery, a second time constant $\tau_n$ corresponding to the negative electrode of the battery, a first constant $A_p$, a second constant $A_n$, and a value of a time variable t of the rest period. The initial voltage $V_0$ of the battery may be a voltage of the battery (e.g., the battery 300 of FIG. 3) at an initial point in time of a rest period. In other words, the initial voltage $V_0$ of the battery may be a voltage of the battery at a point in time t=0 of the rest period. In particular, the calculation unit 512 may calculate the OCV V of the battery in response to a determination that the intercalation flux J at the surface of each of the positive electrode and the negative electrode is equal to 0. Then, the calculation unit 512 may calculate the OCV of the battery using Equation 1 below.

$$V = V_{t=0} + A_p\tau_p e^{-\left(\frac{t}{\tau_p}\right)} - A_n\tau_n e^{-\left(\frac{t}{\tau_n}\right)} \quad \text{Equation 1}$$

Hence, notably, Equation 1 considers exponential decay in the voltage of the battery during the rest period.

The calculation unit 512 may calculate the first time constant $\tau_p$ as a time taken for a voltage corresponding to the positive electrode to drop to 63.2% of a maximum voltage in the time variable t. Similarly, the calculation unit 512 may calculate the first time constant $\tau_n$ as a time taken for a voltage corresponding to the negative electrode to drop to 63.2% of a maximum voltage in the time variable t. The time variable t may be considered as a time duration of the rest period.

In addition, the calculation unit 512 may calculate the first constant $A_p$ using Equation 2 below.

$$A_p = \frac{dU_p}{dSOC_p}\frac{1}{Cs_{p,max}} \quad \text{Equation 2}$$

In Equation 2, $U_p$ denotes an open circuit potential at the positive electrode (e.g., the positive electrode 310 of FIG. 3), $SOC_p$ denotes an SOC at the positive electrode, and $Cs_{p,max}$ denotes a maximum concentration $Cs_{max}$ of an intercalation metal of the battery at the positive electrode.

The calculation unit 512 may calculate $U_p$, $SOC_p$, and $Cs_{p,max}$ values. In an alternative example, the calculation unit 512 may receive values of $U_p$, $SOC_p$, and $Cs_{p,max}$ from the BMS.

Similarly, the calculation unit 512 may calculate the first constant $A_n$ using Equation 3 below.

$$A_n = \frac{dU_n}{dSOC_n}\frac{1}{Cs_{n,max}} \quad \text{Equation 3}$$

In Equation 3, $U_n$ denotes an open circuit potential at the negative electrode (e.g., the negative electrode 320 of FIG. 3), $SOC_n$ denotes an SOC at the negative electrode, and $Cs_{n,max}$ denotes a maximum concentration $Cs_{max}$ of the intercalation metal of the battery at the negative electrode.

In some implementations, the calculation unit 512 may calculate the values of $U_n$, $SOC_n$, and $Cs_{n,max}$. In some implementations, the calculation unit 512 may receive the values of $U_n$, $SOC_n$, and $Cs_{n,max}$ from the BMS.

Referring to operation 401, when the determination unit 510 determines that the intercalation flux J of the battery does not satisfy a predetermined condition (e.g., is not 0), the calculation unit 512 may calculate the OCV V of the battery using the existing techniques.

Subsequently, in operation 405 of FIG. 4, the method 400 may estimate at a battery parameter based on the calculated OCV V of the battery (e.g., the battery 300 of FIG. 3). The estimated battery parameter may be an SOH of the battery, an SOC of the battery, electrochemical parameters of the battery, or an SOS of the battery. In particular, the estimation unit 514 may estimate the SOC of the battery using the OCV V and using electrode time constant dependent logarithmic voltage profiles of the battery. Similarly, the estimation unit 514 may estimate the electrochemical parameters (e.g., solid state diffusion, cell resistance, etc.) that may be estimated using the OCV V and the electrode time constant dependent logarithmic voltage profiles. In addition, the estimation unit 514 may update an existing electrochemical parameter with the estimated electrochemical parameter to accurately estimate the SOH-SOS of the battery 300. The electrochemical parameters may be estimated using known techniques.

Figure 6:
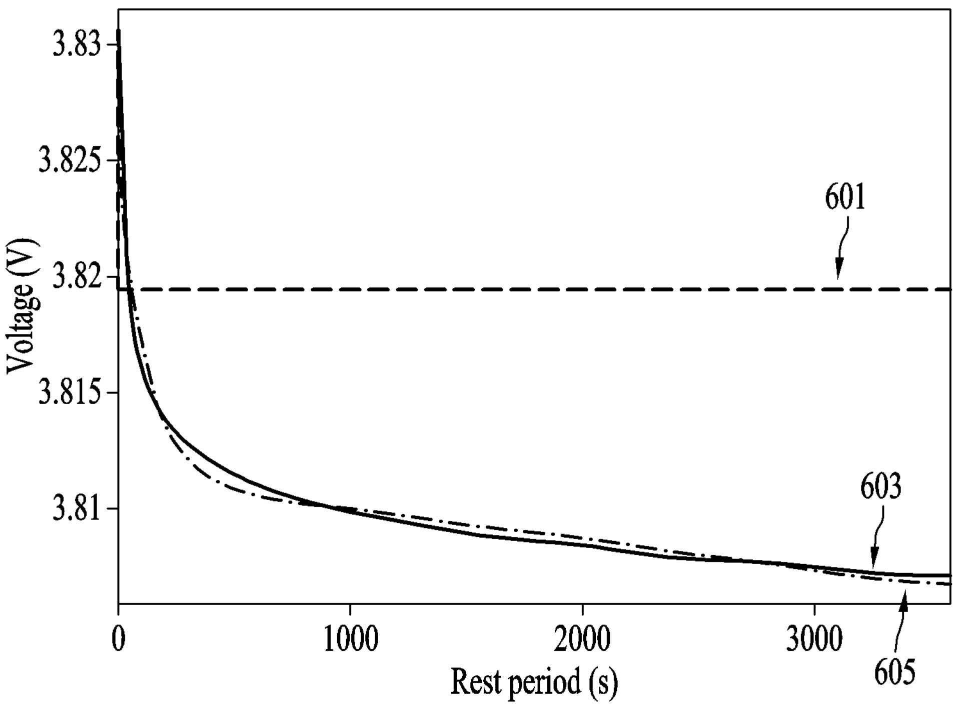
FIG. 6 illustrates an example of a comparison between an actual voltage and an estimated voltage of a battery in a rest period, according to one or more embodiments.

FIG. 6 illustrates an example of a comparison between an actual voltage and an estimated voltage of a battery in a rest period. As illustrated in FIG. 6, curve 603 represents an actual voltage profile of a battery in a rest period, curve 601 represents a voltage profile of the battery estimated by an existing technique in the rest period of the battery, and curve 605 represents a voltage profile of the battery estimated by the disclosed technique in the rest period of the battery.

Accordingly, in some implementations the disclosed technique may provide some of the following advantages. The voltage profile of the battery may be more accurately estimated in the rest period. Electrochemical parameters related to solid state diffusion may be more accurately estimated. If a rest period voltage is captured properly, an SOH and an SOS may also be determined accurately.

The computing apparatuses, the vehicles, the electronic devices, the processors, the memories, the battery management systems, the storage devices, the wireless devices, and other apparatuses, devices, units, modules, and components described herein with respect to FIGS. 1-6 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-6 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A processor-implemented method of estimating a battery parameter of a battery for a rest period of the battery, the method comprising:

based on determining that an intercalation flux of the battery satisfies a predetermined condition, calculating an open circuit voltage (OCV) of the battery, wherein the OCV is calculated based on an initial voltage, a first time constant corresponding to a positive electrode of the battery, a second time constant corresponding to a negative electrode of the battery, a first constant, a second constant, and a value of a time variable for the rest period;

estimating the battery parameter based on the calculated OCV of the battery; and controlling charging and discharging of the battery based on a result of the estimating, wherein the first constant corresponds to the positive electrode of the battery, and wherein the method further comprises:

calculating the first constant based on an open circuit potential at the positive electrode of the battery, a state of charge (SOC) at the positive electrode of the battery, and a maximum concentration of an intercalation metal of the battery at the positive electrode of the battery.

2. The method of claim 1, wherein the second constant corresponds to the negative electrode of the battery, and wherein the method further comprises:

calculating the second constant based on an open circuit potential at the negative electrode of the battery, an SOC at the negative electrode of the battery, and a maximum concentration of an intercalation metal of the battery at the negative electrode of the battery.

3. The method of claim 1, wherein the determining corresponds to the intercalation flux at a surface of each of the positive electrode and the negative electrode of the battery being equal to 0.

4. The method of claim 1, wherein the initial voltage of the battery is a voltage of the battery at the start of the rest period.

5. The method of claim 1, wherein the battery parameter comprises a state of health (SOH) of the battery, an SOC of the battery, an electrochemical parameter of the battery, or a state of short (SOS) of the battery.

6. A system for estimating a battery parameter for a rest period, the system comprising:

one or more processors;

memory storing instructions configured to, when executed by the one or more processors, cause the one or more processors to:

determine whether an intercalation flux condition of a battery is satisfied;

based on the determining, calculate an open circuit voltage (OCV) of the battery based on an initial voltage of the battery, a first time constant corresponding to a positive electrode of the battery, a second time constant corresponding to a negative electrode of the battery, a first constant, a second constant, and a value of a time variable;

estimate a battery parameter based on the calculated OCV; and control charging and discharging of the battery based on a result of the estimating.

7. The system of claim 6, wherein the first constant corresponds to the positive electrode of the battery, and wherein the instructions are further configured to cause the one or more processors to calculate the first constant based on an open circuit potential at the positive electrode of the battery, a state of charge (SOC) at the positive electrode of the battery, and a maximum concentration of an intercalation metal of the positive electrode.

8. The system of claim 6, wherein the second constant corresponds to the negative electrode of the battery, and wherein the instructions is further configured to cause the one or more processors to calculate the second constant based on an open circuit potential at the negative electrode of the battery, an SOC at the negative electrode of the battery, and a maximum concentration of an intercalation metal of the negative electrode.

9. The system of claim 6, wherein the determining corresponds to the intercalation flux at a surface of each of the positive electrode and the negative electrode of the battery being equal to 0.

10. The system of claim 6, wherein the initial voltage of the battery is a voltage of the battery at an initial point in time of the rest period.

11. The system of claim 6, wherein the battery parameter comprises a state of health (SOH) of the battery, an SOC of the battery, electrochemical parameters of the battery, or a state of short (SOS) of the battery.

12. A processor-implemented method of determining an open circuit voltage (OCV) of a battery having a positive electrode and a negative electrode, the method comprising:

based on determining that an intercalation flux condition of the battery is met in association with a rest period of the battery:

determining an initial voltage of the rest period;

determining a positive electrode component based on a state of charge (SOC) of the positive electrode or an open circuit potential of the positive electrode;

determining a negative electrode component based on an SOC of the negative electrode or an open circuit potential of the negative electrode;

determining the OCV of the battery based on the initial voltage, the positive electrode component, and the negative electrode component, wherein the determining the OCV comprises adding the initial voltage, the negative electrode component, and the positive electrode component; and controlling charging and discharging of the battery based on the determined OCV.

13. The method of claim 12, wherein the negative electrode component is determined based also on a maximum concentration of intercalation metal at the negative electrode, and wherein the positive electrode component is determined based also on a maximum concentration of intercalation metal at the positive electrode.

14. The method of claim 12, wherein the OCV is determined as a function of time for the rest period and wherein the OCV as a function of time models exponential voltage decay during the rest period.

15. The method of claim 12, wherein the method is performed by a battery management system that manages charging of the battery.

16. The method of claim 12, wherein the intercalation flux condition corresponds to 0 intercalation flux at both the positive and the negative electrodes.

17. The method of claim 12, further comprising computing a battery parameter based on the OCV, wherein the battery parameter is either a state of health (SOH) of the battery, an SOC of the battery, an electrochemical parameter of the battery, or a state of short (SOS) of the battery.

* * * * *